(12) United States Patent
Gundogan et al.

(10) Patent No.: US 11,483,945 B2
(45) Date of Patent: Oct. 25, 2022

(54) HIGH-DENSITY CABLE MANAGEMENT BAR

(71) Applicant: EMC IP Holding Company LLC, Hopkinton, MA (US)

(72) Inventors: Ilhan C. Gundogan, Lexington, MA (US); Keith C. Johnson, Medway, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 221 days.

(21) Appl. No.: 16/523,475

(22) Filed: Jul. 26, 2019

(65) Prior Publication Data
US 2021/0029845 A1  Jan. 28, 2021

(51) Int. Cl.
*H05K 7/14* (2006.01)
(52) U.S. Cl.
CPC .................................. *H05K 7/1491* (2013.01)
(58) Field of Classification Search
USPC ..... 174/68.2, 68.1, 70 R; 248/74.2, 74.1, 65, 248/63, 62, 56, 49; 211/26.2, 26
See application file for complete search history.

(56) References Cited

U.S. PATENT DOCUMENTS

| | | | | |
|---|---|---|---|---|
| 7,817,444 B2* | 10/2010 | Dennes | ................... | H02G 3/30 361/826 |
| 8,464,984 B2* | 6/2013 | Laursen | ................... | H02G 3/30 248/68.1 |
| 8,730,678 B1* | 5/2014 | Cunningham | ....... | H05K 7/1491 174/72 A |
| 8,816,199 B1* | 8/2014 | French | ................. | H05K 7/1491 174/59 |
| 9,703,061 B1* | 7/2017 | Fernandez | ........... | H02G 3/0456 |
| 2005/0067358 A1* | 3/2005 | Lee | ...................... | H05K 7/1491 211/26 |
| 2009/0038845 A1* | 2/2009 | Fransen | ................... | H04Q 1/13 174/72 R |
| 2014/0001314 A1* | 1/2014 | Gong | ....................... | H02G 3/02 248/49 |
| 2015/0103488 A1* | 4/2015 | Tanaka | ................. | H05K 7/1491 361/679.58 |
| 2019/0192942 A1* | 6/2019 | Grisafi | ............... | A63B 69/0095 |
| 2021/0127515 A1* | 4/2021 | Wang | ................... | H05K 5/0226 |

* cited by examiner

*Primary Examiner* — Alfred J Wujciak
(74) *Attorney, Agent, or Firm* — Amin, Turocy & Watson, LLP

(57) ABSTRACT

Example high-density cable management bars are provided. In an example, a cable management bar comprises a cable channel configured to fit one or more cables and comprising a first end and a second end. The cable management bar can also comprise a first attachment point extending perpendicular from the first end. The cable management bar can also comprise a second attachment point extending perpendicular from the second end, the first attachment point and the second attachment point configured to attach to a rackmount computer, the cable management system configured to extend away from a rack in which the rackmount computer is located when attached to the rackmount computer via the first attachment point and the second attachment point, and when the rackmount computer is mounted in a rack.

20 Claims, 8 Drawing Sheets

HIGH-DENSITY CABLE MANAGEMENT BAR

TECHNICAL FIELD

The present application relates generally to managing cables for a computer system.

BACKGROUND

A computer system can be connected with multiple cables, such as cables for electrical power, and cables for computer networking. A cable management bar can be utilized to organize and secure cables for some computer systems.

BRIEF DESCRIPTION OF THE DRAWINGS

Numerous aspects, embodiments, objects, and advantages of the present invention will be apparent upon consideration of the following detailed description, taken in conjunction with the accompanying drawings, in which like reference characters refer to like parts throughout, and in which.

DETAILED DESCRIPTION

Overview

Some cable management bars can comprise a fixed bar that allows cables to lay above a computer system enclosure, so can require a one rack-unit height (1U) space dedicated over the computer system enclosure. A problem with such a design is that the cable management bar can occupy vertical space in a server rack, which could otherwise be occupied by a computer system. In some examples, much work goes into keeping product U height to a minimum, and having cable management go outside the envelope of the associated computer system might not be a best use of rack real estate.

A problem with some cable management bars can relate to the volume of the cables. An excessive volume of cables that exit a rear of a computer system chassis can make it difficult for users to access and service the computer system without disturbing other cables. Such a computer system can comprise one or more field replaceable units (FRUs; which can include input/output (I/O) devices and power supplies), which can be added to a computer system chassis and removed from a computer system chassis as part of servicing the computer system.

In some examples, a solution to such a problem with some cable management systems can be to provide a high-density cable management chassis that allows system cables to be arranged in such a way that the cables exit the cable management bar on the left and right of the chassis for dual power and signal zones at a rear of a computer storage rack. Furthermore, in some examples, a solution to such a problem with some cable management systems can be to provide a channel on which cables are dressed and contained, where the channel can pivot to provide easy access to the rear of an associated computer system for servicing. Furthermore, in some examples, a solution to such a problem with some cable management systems can be to provide an intuitive service process and experience.

An example cable management bar according to the present techniques can comprise two positions: baseline; and pivot up to provide access to a chassis of an associated computer system, access to FRUs, and cables. An example cable management bar according to the present techniques can allow for access to various FRUs without putting pressure on all the cables of the server.

An example cable management bar according to the present techniques can comprise a push latch on each side of a cable management bar, that can unlatch from a baseline position, and allow for pivot articulation. An example cable management bar according to the present techniques can comprise tabs to hold cables in the channel while adding or removing cables. There can be rubber straps that can be utilized to hold down a bundle of cables without the use of zip ties or Velcro straps.

Example Views

Figure 1:
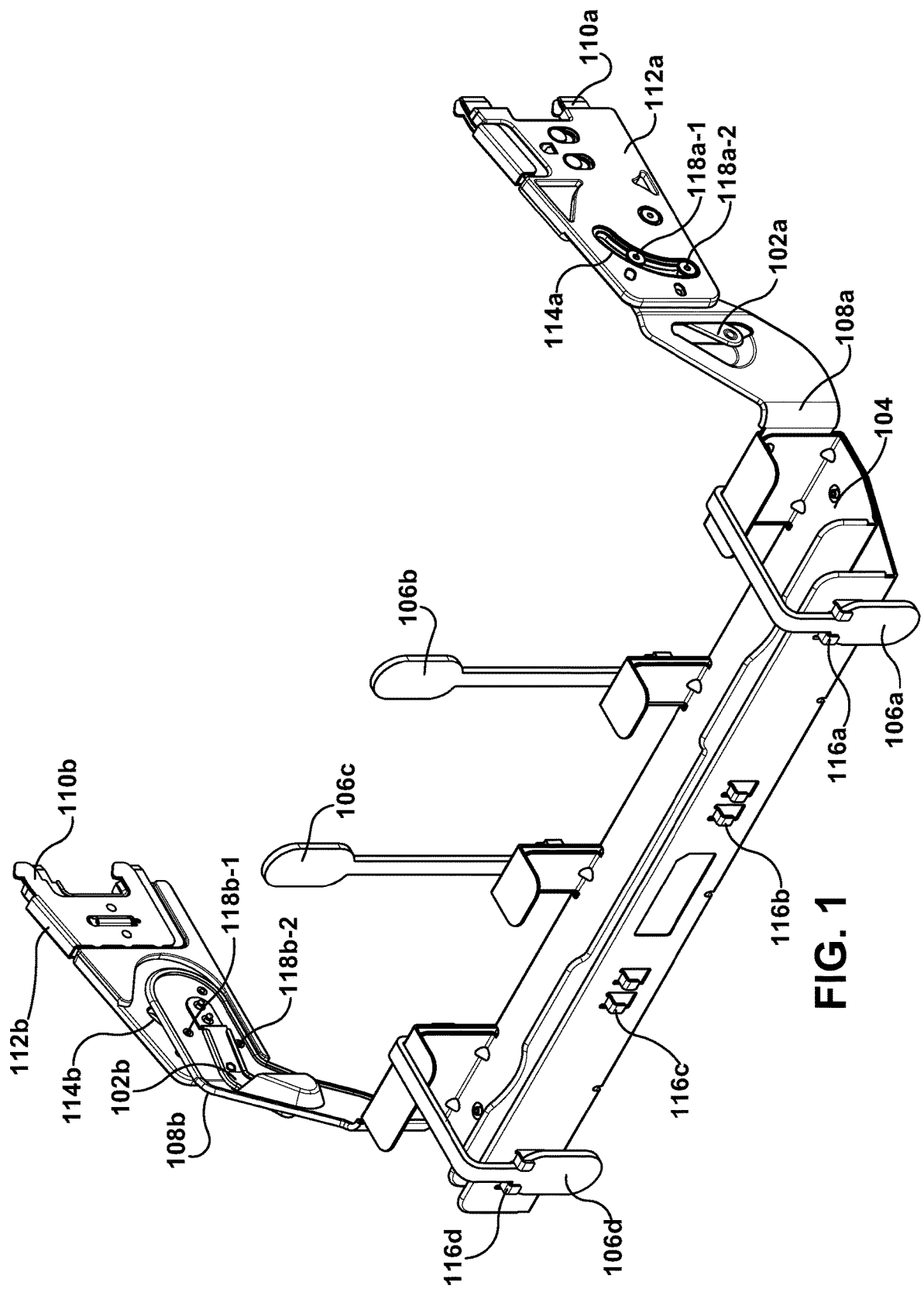
FIG. 1 illustrates an oblique view of an example high-density cable management bar, in accordance with certain embodiments of this disclosure.

FIG. 1 illustrates an oblique view of an example high-density cable management bar 100, in accordance with certain embodiments of this disclosure. High-density cable management bar 100 comprises latch 102a, latch 102b, cable channel 104, cable strap 106a, cable strap 106b, cable strap 106c, cable strap 106d, side 108a, side 108b, server attachment 110a, server attachment 110b, attachment head 112a, attachment head 112b, pivot channel 114a, pivot channel 114b, strap fastener 116a, strap fastener 116b, strap fastener 116c, strap fastener 116d, pivot limiter 118a-1, pivot limiter 118a-2, pivot limiter 118b-1, and pivot limiter 118b-2.

Latch 102a and latch 102b can each comprise a push latch that, when depressed, permits a portion of high-density cable management bar 100 to pivot or tilt. That is, a portion of high-density cable management bar 100 (which can comprise latch 102a, latch 102b, cable channel 104, cable strap 106a, cable strap 106b, cable strap 106c, cable strap 106d, side 108a, side 108b, strap fastener 116a, strap fastener 116b, strap fastener 116c, and strap fastener 116d) can pivot relative to another portion of high-density cable management bar 100 (which can comprise server attachment 110a, server attachment 110b, attachment head 112a, and attachment head 112b). The axis that a portion of high-density cable management bar 100 pivots on can be defined by a point at which side 108a connects with server attachment 110a, and a point at which side 108b connects with server attachment 110b.

In some examples, a push latch can comprise a mechanism that has two states—depressed and not-engaged. Where a push latch is actively depressed (such as by a person pressing a finger into the push latch), the push latch can be depressed. Then, where a push latch is not actively depressed, it is in a not-engaged state, or returns to a not-engaged state.

As depicted, high-density cable management bar 100 can be referred to as being in a neutral position. In some examples, when latch 102a and latch 102b are not depressed, a portion of high-density cable management bar 100 can be pivoted from an upward tilt position to the neutral position, or from an intermediary position between an upward tilt position and the neutral position to either an upward tilt position or the neutral position. Then, when latch 102a and latch 102b are not depressed, and high-density cable management bar 100 is in the neutral position, high-density cable management bar 100 is locked in that neutral position, and can be pivoted after depressing both latch 102a and latch 102b.

It can be appreciated that there can be examples that implement other embodiments of latches than the push latches of latch 102a and latch 102b. For example, in some examples, high-density cable management bar 100 can lock into place whenever its latches are not actively being depressed. In some examples, a high-density cable management bar can comprise a different number of latches for pivoting, such as one latch, or more than two latches.

In some examples, different types of latches than push latches can be utilized. For example, latches can be utilized that are actively pressed to transition between a depressed state and a not-engaged state. In such examples, pressing a latch in a not-engaged state can transition the latch to a depressed state, where the latch can hold this state. Then, pressing the latch again in the depressed state can transition to latch back to the not-engaged state.

Cable channel 104 can comprise a channel that is substantially bounded on three sides, suitable for holding and securing computer cables. These computer cables can be computer cables attached to a rackmount server that high-density cable management bar 100 is attached to. Then, a fourth side of cable channel 104 can be partially covered by straps—shown here as cable strap 106a, cable strap 106b, cable strap 106c, and cable strap 106d. One or more of cable strap 106a, cable strap 106b, cable strap 106c, cable strap 106d can be unfastened to permit cables to be laid in cable channel 104, and then fastened to secure cables in cable channel 104. It can be appreciated that the example of high-density cable management bar 100 depicts four straps (cable strap 106a, cable strap 106b, cable strap 106c, and cable strap 106d), and that there can be example high-density cable management bars that comprise more or fewer than four straps, or that do not implement straps.

Cable strap 106a, cable strap 106b, cable strap 106c, and cable strap 106d can be permanently fastened to one side of cable channel 104. Then, cable strap 106a, cable strap 106b, cable strap 106c, and cable strap 106d can be secured to another side of cable channel 104 via strap fastener 116a, strap fastener 116b, strap fastener 116c, and strap fastener 116d, respectively. On the side of cable channel 104 that contains the strap fasteners (strap fastener 116a, strap fastener 116b, strap fastener 116c, and strap fastener 116d), each strap (cable strap 106a, cable strap 106b, cable strap 106c, and cable strap 106d) can be optionally secured to cable channel 104 via a respective strap fastener (strap fastener 116a, strap fastener 116b, strap fastener 116c, and strap fastener 116d), and released so as to facilitate placing a cable in cable channel 104.

Side 108a and side 108b each extend away from cable channel 104. In some examples, side 108a and side 108b can provide a spacing between cable channel 104 and an associated rackmount server, both to facilitate channeling cables (since, in some examples, a longer length of side 108a and side 108b can facilitate curving a cable more gently than a shorter length of side 108a and side 108b, or an example that omits side 108a and side 108b), and to separate cable channel 104 and an associated rackmount server for a purpose of facilitating heat dissipation of the associated rackmount server. In some examples, side 108a and side 108b can flare in toward a center line of cable channel 104 as side 108a and side 108b extend out and away from cable channel 104.

Server attachment 110a, server attachment 110b can comprise hooks that can engage with corresponding features of a rackmount server to attach high-density cable management bar 100 to the rackmount server. In some examples, the hooks of server attachment 110a and server attachment 110b can be spring loaded. In these examples, high-density cable management bar 100 can be attached to a rackmount server by pressing high-density cable management bar 100 into the rackmount server.

To detach high-density cable management bar 100 from a rackmount server, latch 102a and latch 102b can be depressed causing the hooks of server attachment 110a and server attachment 110b to disengage. That is, when latch 102a and latch 102b are depressed, the hooks of server attachment 110a and server attachment 110b can disengage. And when latch 102a and latch 102b are not engaged, the hooks of server attachment 110a and server attachment 110b can engage.

It can be appreciated that there can be examples that use a different approach to attach a high-density cable management bar to a rackmount server. Additionally, it can be appreciated that there can be examples that use latches or other devices to cause the hooks of server attachment 110a and server attachment 110b to engage or disengage that are separate from latch 102a and latch 102b.

Attachment head 112a and attachment head 112b can comprise server attachment 110a and server attachment 110b. Attachment head 112a and attachment head 112 can be rotationally coupled to side 108a and side 108b, respectively, so that side 108a and side 108b (and latch 102a, latch 102b, cable channel 104, cable strap 106a, cable strap 106b, cable strap 106c, cable strap 106d, strap fastener 116a, strap fastener 116b, strap fastener 116c, and strap fastener 116d) can rotationally pivot relative to attachment head 112a, attachment head 112b, server attachment 110a, and server attachment 110b.

Pivot channel 114a and pivot channel 114b define an amount of pivoting permitted by high-density cable management bar 100. Pivot channel 114a and pivot channel 114b contain pivot limiter 118a-1 and pivot limiter 118a-2, and pivot limiter 118b-1 and pivot limiter 118b-2, respectively. The length of pivot channel 114a and pivot channel 114b defines how far pivot limiter 118a-1, pivot limiter 118a-2, pivot limiter 118b-1, and pivot limiter 118b-2 can travel within pivot channel 114a and pivot channel 114b, respectively, which in turn defines how much high-density cable management bar 100 can pivot (e.g., how much cable channel 104 can pivot relative to attachment head 112a and attachment head 112b).

In some examples, the following materials can be used to implement high-density cable management bar 100. In some examples, each of latch 102a, latch 102b, cable channel 104, side 108a, side 108b, server attachment 110a, server attachment 110b, attachment head 112a, attachment head 112b, strap fastener 116a, strap fastener 116b, strap fastener 116c, strap fastener 116d, pivot limiter 118a-1, pivot limiter 118a-2, pivot limiter 118b-1, and pivot limiter 118b-2 can each be implemented with one or more metals. In some examples, each of cable strap 106a, cable strap 106b, cable strap 106c, cable strap 106d can be implemented with one or more flexible materials, such as a rubber. In some examples, each of pivot channel 114a and pivot channel 114b are an opening defined in attachment head 112a and attachment head 112b, respectively. It can be appreciated that there can be examples where one or more other materials are used to implement one or more parts of a high-density cable management bar.

Figure 2:
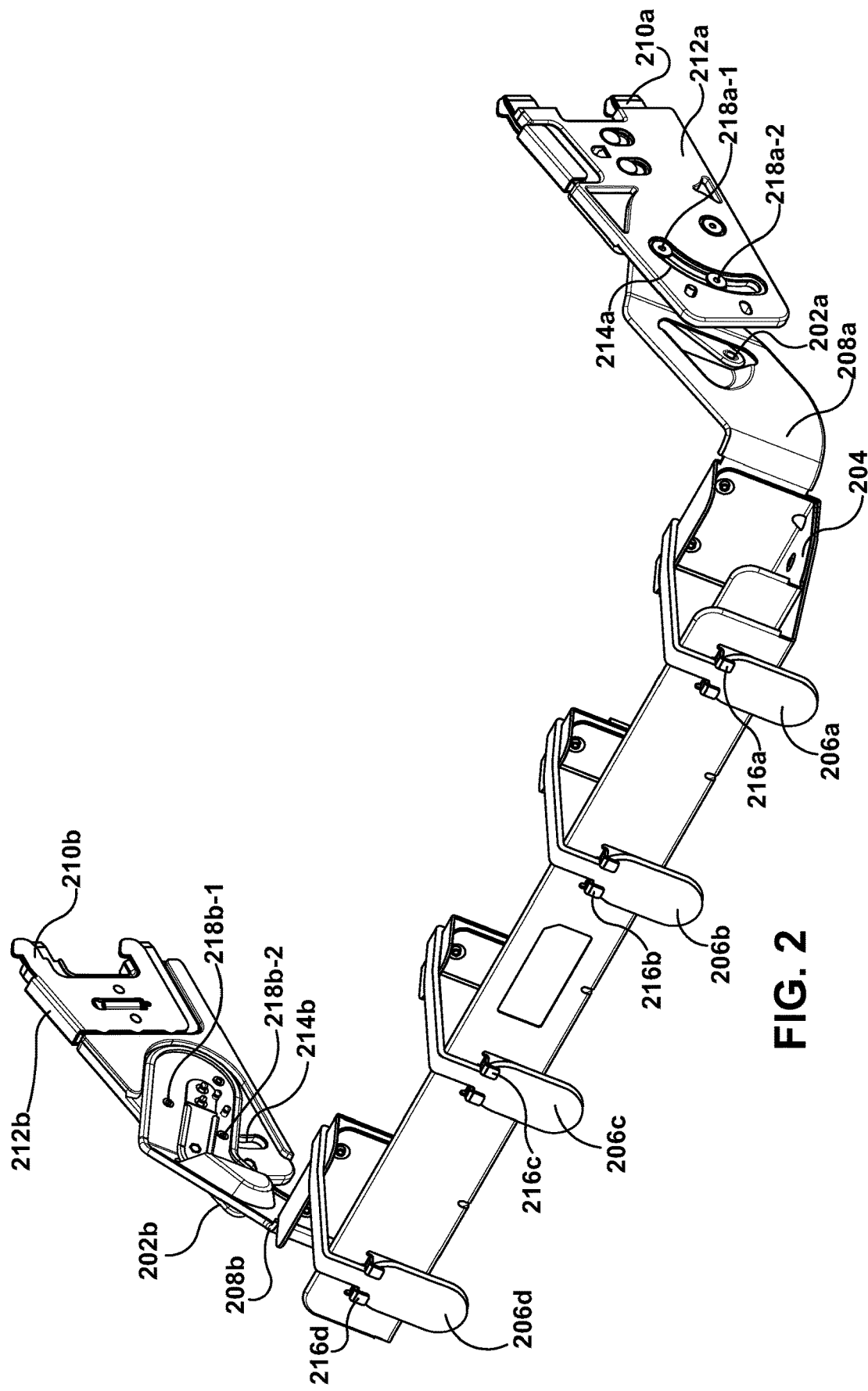
FIG. 2 illustrates a side view of an example high-density cable management bar that is tilted up, in accordance with certain embodiments of this disclosure.

FIG. 2 illustrates a side view of an example high-density cable management bar 200 that is tilted up, in accordance with certain embodiments of this disclosure. In some examples, high-density cable management bar 200 can be high-density cable management bar 100 of FIG. 1 after high-density cable management bar 100 has been manipulated to be tilted up. As depicted, high-density cable management bar 200 comprises latch 202a, latch 202b, cable channel 204, cable strap 206a, cable strap 206b, cable strap 206c, cable strap 206d, side 208a, side 208b, server attachment 210a, server attachment 210b, attachment head 212a, attachment head 212b, pivot channel 214a, pivot channel 214b, strap fastener 216a, strap fastener 216b, strap fastener 216c, strap fastener 216d, pivot limiter 218a-1, pivot limiter 218a-2, pivot limiter 218b-1, and pivot limiter 218b-2.

In some examples, latch 202a can be similar to latch 102a of FIG. 1; latch 202b can be similar to latch 102a of FIG. 1; cable channel 204 can be similar to cable channel 104 of FIG. 1; cable strap 206a can be similar to cable strap 106a of FIG. 1; cable strap 206b can be similar to cable strap 106b of FIG. 1; cable strap 206c can be similar to cable strap 106c of FIG. 1; cable strap 206d can be similar to cable strap 106d of FIG. 1; side 208a can be similar to side 108a of FIG. 1; side 208b can be similar to side 108b of FIG. 1; server attachment 210a can be similar to server attachment 110a of FIG. 1; server attachment 210b can be similar to server attachment 110b of FIG. 1; attachment head 212a can be similar to attachment head 112a of FIG. 1; attachment head 212b can be similar to attachment head 112b of FIG. 1; pivot channel 214a can be similar to pivot channel 114a of FIG. 1; pivot channel 214b can be similar to pivot channel 114b of FIG. 1; strap fastener 216a can be similar to strap fastener 116a of FIG. 1; strap fastener 216b can be similar to strap fastener 116b of FIG. 1; strap fastener 216c can be similar to strap fastener 116c of FIG. 1; strap fastener 216d can be similar to strap fastener 116d of FIG. 1; pivot limiter 218a-1 can be similar to pivot limiter 118a-1 of FIG. 1; pivot limiter 218a-2 can be similar to pivot limiter 118a-2 of FIG. 1; pivot limiter 218b-1; can be similar to pivot limiter 118b-1 of FIG. 1; and pivot limiter 218b-2 can be similar to pivot limiter 118b-2 of FIG. 1.

As can be seen, and relative to high-density cable management bar 100 of FIG. 1, with high-density cable management bar 200, a portion of high-density cable management bar 200 (which can comprise latch 202a, latch 202b, cable channel 204, cable strap 206a, cable strap 206b, cable strap 206c, cable strap 206d, side 208a, side 208b, strap fastener 216a, strap fastener 216b, strap fastener 216c, and strap fastener 216d) is pivoted up relative to another portion of high-density cable management bar 200 (which can comprise server attachment 210a, server attachment 210b, attachment head 212a, and attachment head 212b).

Figure 3:
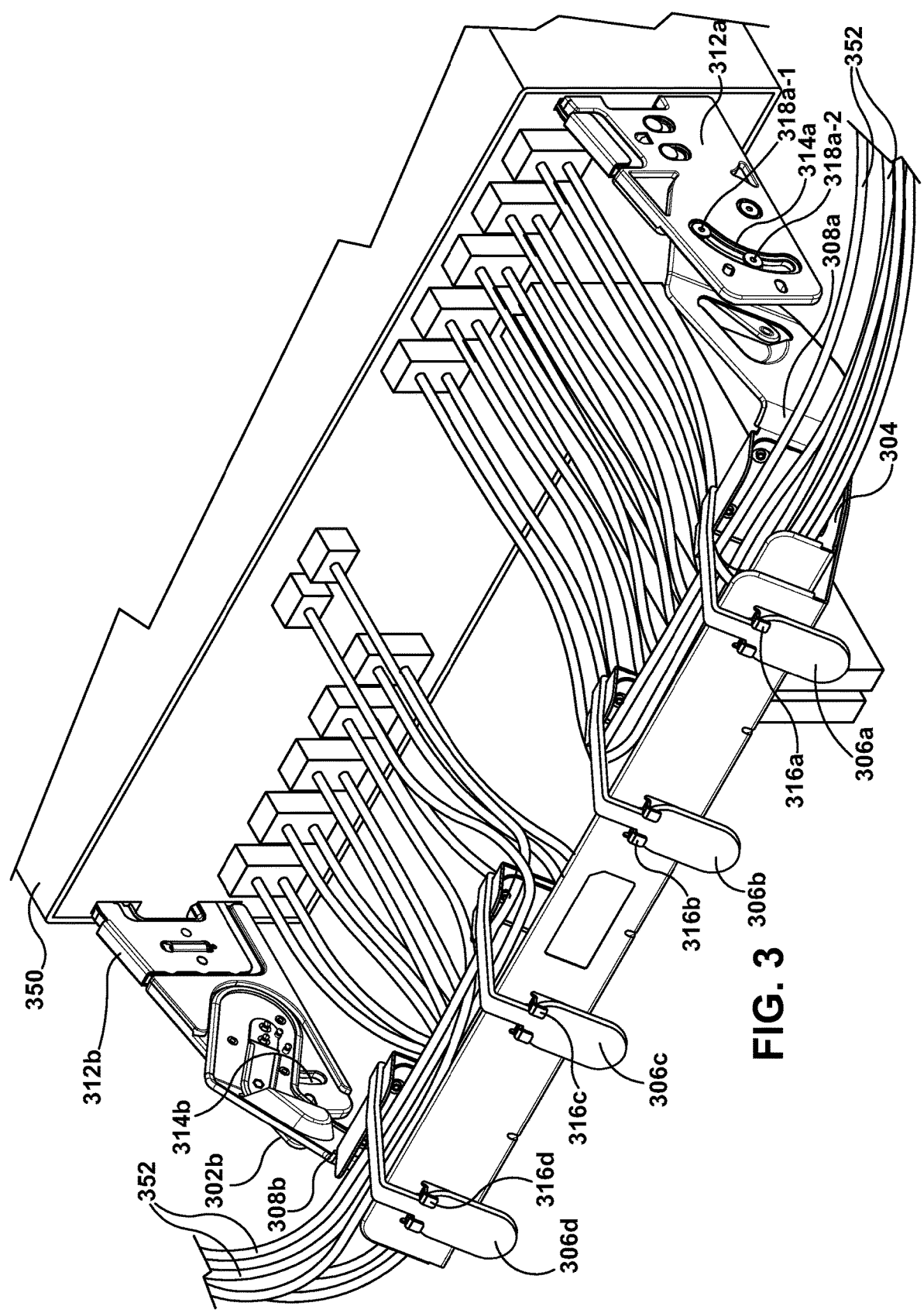
FIG. 3 illustrates a side view of an example high-density cable management bar that is tilted up and attached to a rackmount server, in accordance with certain embodiments of this disclosure.

FIG. 3 illustrates a side view of an example high-density cable management bar 300 that is tilted up and attached to a rackmount server, in accordance with certain embodiments of this disclosure. In some examples, high-density cable management bar 300 can be high-density cable management bar 200 of FIG. 2 after high-density cable management bar 200 has been attached to a rackmount server 350, and fitted with cables 352. As depicted, high-density cable management bar 300 comprises latch 302a, latch 302b, cable channel 304, cable strap 306a, cable strap 306b, cable strap 306c, cable strap 306d, side 308a, side 308b, attachment head 312a, attachment head 312b, pivot channel 314a, pivot channel 314b, strap fastener 316a, strap fastener 316b, strap fastener 316c, strap fastener 316d, pivot limiter 318a-1, and pivot limiter 318a-2.

In some examples, latch 302a can be similar to latch 202a of FIG. 2; latch 302b can be similar to latch 202a of FIG. 2; cable channel 304 can be similar to cable channel 204 of FIG. 2; cable strap 306a can be similar to cable strap 206a of FIG. 2; cable strap 306b can be similar to cable strap 206b of FIG. 2; cable strap 306c can be similar to cable strap 206c of FIG. 2; cable strap 306d can be similar to cable strap 206d of FIG. 2; side 308a can be similar to side 208a of FIG. 2; side 308b can be similar to side 208b of FIG. 2; attachment head 312a can be similar to attachment head 212a of FIG. 2; attachment head 312b can be similar to attachment head 212b of FIG. 2; pivot channel 314a can be similar to pivot channel 214a of FIG. 2; pivot channel 314b can be similar to pivot channel 214b of FIG. 2; strap fastener 316a can be similar to strap fastener 216a of FIG. 2; strap fastener 316b can be similar to strap fastener 216b of FIG. 2; strap fastener 316c can be similar to strap fastener 216c of FIG. 2; strap fastener 316d can be similar to strap fastener 216d of FIG. 2; pivot limiter 318a-1 can be similar to pivot limiter 218a-1 of FIG. 2; and pivot limiter 318a-2 can be similar to pivot limiter 218a-2 of FIG. 2.

Figure 4:
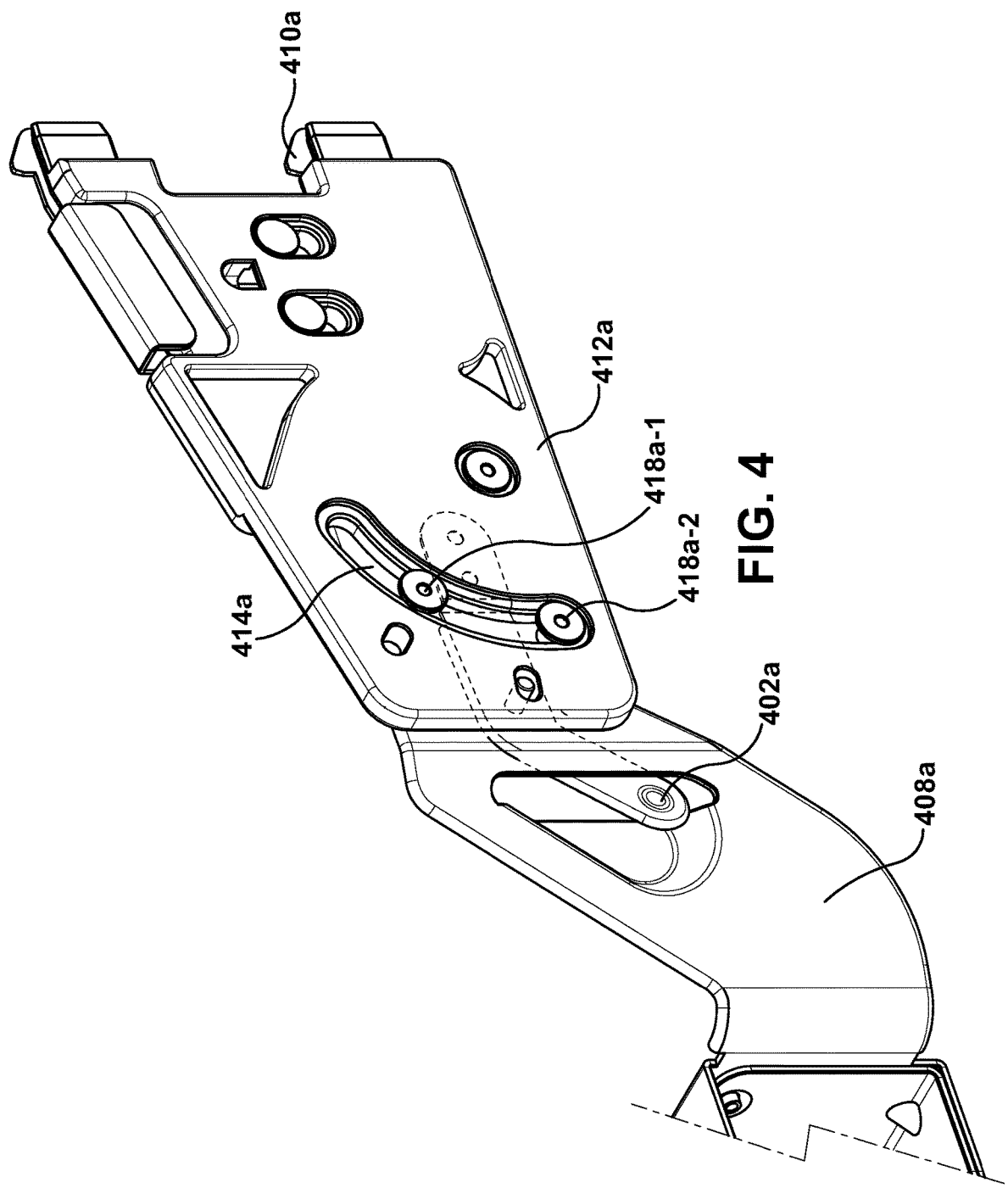
FIG. 4 illustrates a close up of a side of an example high-density cable management bar, in accordance with certain embodiments of this disclosure.

FIG. 4 illustrates a close up of a side of an example high-density cable management bar 400, in accordance with certain embodiments of this disclosure. In some examples, high-density cable management bar 400 can be high-density cable management bar 100 of FIG. 1, from a different view. As depicted, high-density cable management bar 400 comprises latch 402a, side 408a, server attachment 410a, attachment head 412a, pivot channel 414a, pivot limiter 418a-1, and pivot limiter 418a-2.

In some examples, latch 402a can be similar to latch 102a of FIG. 1; side 408a can be similar to side 108a of FIG. 1; server attachment 410a can be similar to server attachment 110a of FIG. 1; attachment head 412a can be similar to attachment head 112a of FIG. 1; pivot channel 414a can be similar to pivot channel 114a of FIG. 1; pivot limiter 418a-1 can be similar to pivot limiter 118a-1 of FIG. 1, and pivot limiter 418a-2 can be similar to pivot limiter 118a-2 of FIG. 1.

Figure 5:
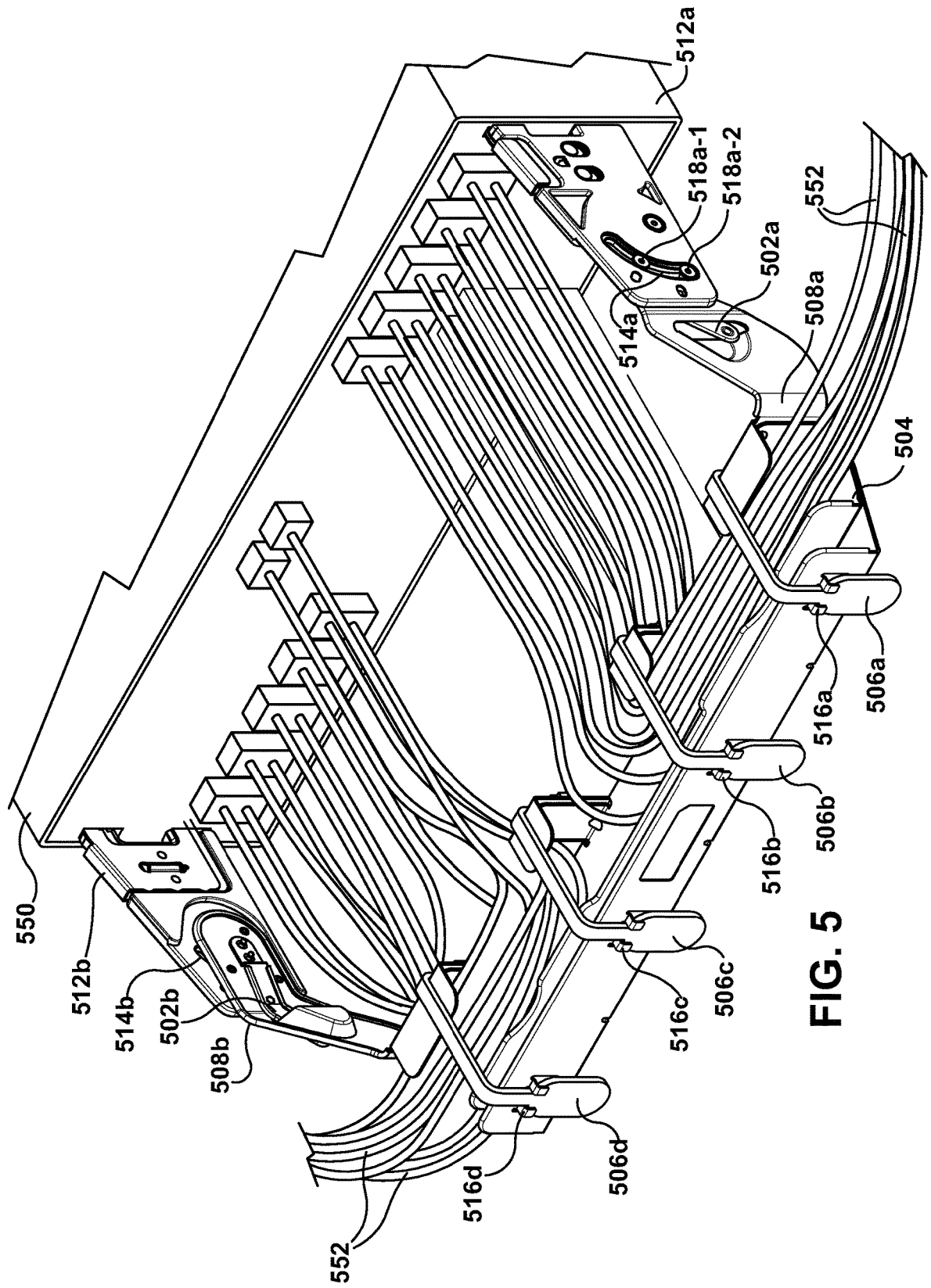
FIG. 5 illustrates an example high-density cable management bar as attached to a rackmount server and managing cables of the rackmount server, in accordance with certain embodiments of this disclosure.

FIG. 5 illustrates an example high-density cable management bar 500 as attached to a rackmount server and managing cables of the rackmount server, in accordance with certain embodiments of this disclosure. In some examples, high-density cable management bar 500 can be high-density cable management bar 100 of FIG. 1 after high-density cable management bar 100 has been attached to a rackmount server, and cabling been run through high-density cable management bar 100. As depicted, high-density cable management bar 500 comprises latch 502a, latch 502b, cable channel 504, cable strap 506a, cable strap 506b, cable strap 506c, cable strap 506d, side 508a, side 508b, attachment head 512a, attachment head 512b, pivot channel 514a, pivot channel 514b, strap fastener 516a, strap fastener 516b, strap fastener 516c, strap fastener 516d, pivot limiter 518a-1, and pivot limiter 518a-2.

In some examples, latch 502a can be similar to latch 102a of FIG. 1; latch 502b can be similar to latch 102a of FIG. 1; cable channel 504 can be similar to cable channel 104 of FIG. 1; cable strap 506a can be similar to cable strap 106a of FIG. 1; cable strap 506b can be similar to cable strap 106b of FIG. 1; cable strap 506c can be similar to cable strap 106c of FIG. 1; cable strap 506d can be similar to cable strap 106d of FIG. 1; side 508a can be similar to side 108a of FIG. 1; side 508b can be similar to side 108b of FIG. 1; attachment head 512a can be similar to attachment head 112a of FIG. 1; attachment head 512b can be similar to attachment head 112b of FIG. 1; pivot channel 514a can be similar to pivot channel 114a of FIG. 1; pivot channel 514b can be similar to pivot channel 114b of FIG. 1; strap fastener 516a can be similar to strap fastener 116a of FIG. 1; strap fastener 516b can be similar to strap fastener 116b of FIG. 1; strap fastener 516c can be similar to strap fastener 116c of FIG. 1; strap fastener 516d can be similar to strap fastener 116d of FIG. 1; pivot limiter 518a-1 can be similar to pivot limiter 118a-1 of FIG. 1; and pivot limiter 518a-2 can be similar to pivot limiter 118a-2 of FIG. 1.

As depicted, cables 552 of rackmount server 550 are routed through cable channel 504. Cables 552 enter cable channel 504 through a midsection of cable channel 504, then are directed to either end of cable channel 504, where cables 552 exit cable channel 504. Cables 552 are secured within cable channel 504 via cable strap 506a, cable strap 506b, cable strap 506c, and cable strap 506d.

Figure 6:
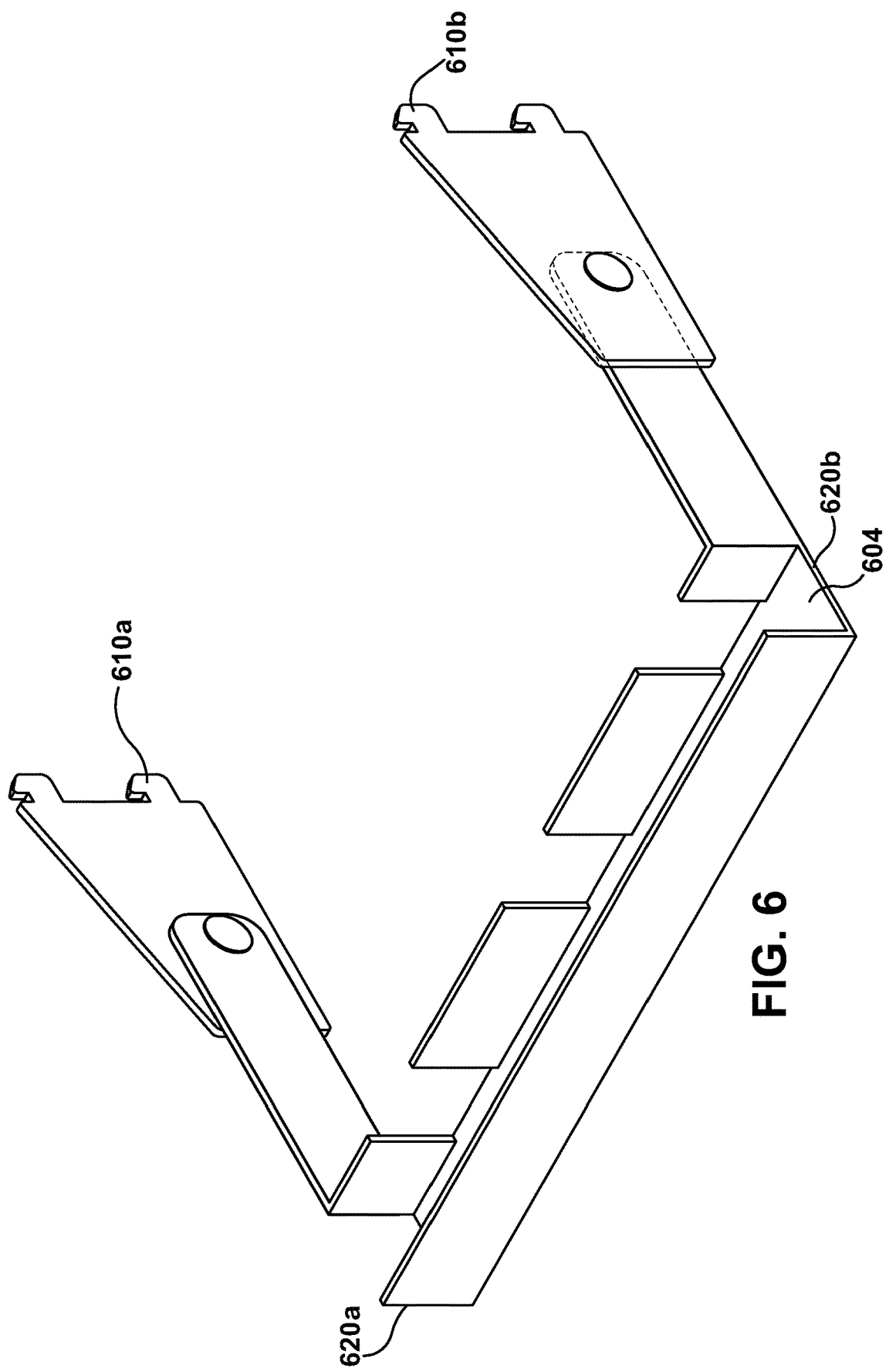
FIG. 6 illustrates another example high-density cable management bar, in accordance with certain embodiments of this disclosure.

FIG. 6 illustrates another example high-density cable management bar 600, in accordance with certain embodiments of this disclosure. As depicted, high-density cable management bar 600 comprises cable channel 604, first end 620a, second end 620b, first attachment point 610a, and second attachment point 610b. In some examples, cable channel 604 can be similar to cable channel 104 of FIG. 1. Cable channel 604 can have a first end and a second end, depicted here as first end 620a and second end 620b, respectively. First attachment point 610a, and second attachment point 610b can be similar to first attachment point 110a of FIG. 1, and second attachment point 110b of FIG. 1, respectively.

Example System

Figure 7:
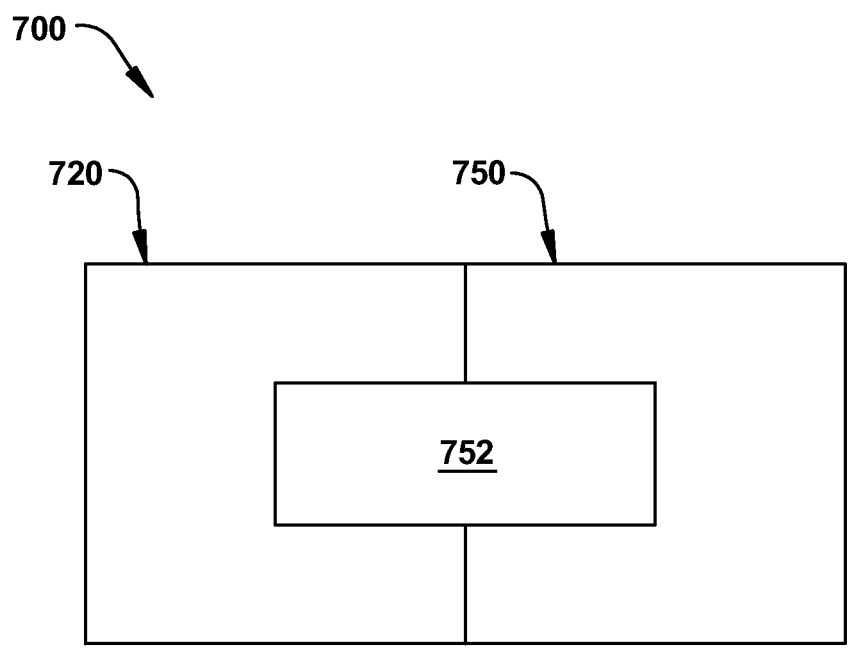
FIG. 7 illustrates an example system, in accordance with certain embodiments of this disclosure.

FIG. 7 illustrates an example system 700, in accordance with certain embodiments of this disclosure. As depicted, system 700 comprises high-density cable-management bar 720, server 750, and cables 752. In some examples, high-density cable-management bar 720 can be similar to high-density cable-management bar 100 of FIG. 1; server 750 can be similar to server 550 of FIG. 5; and cables 752 can be similar to cables 552 of FIG. 5.

Example Operating Procedures

Figure 8:
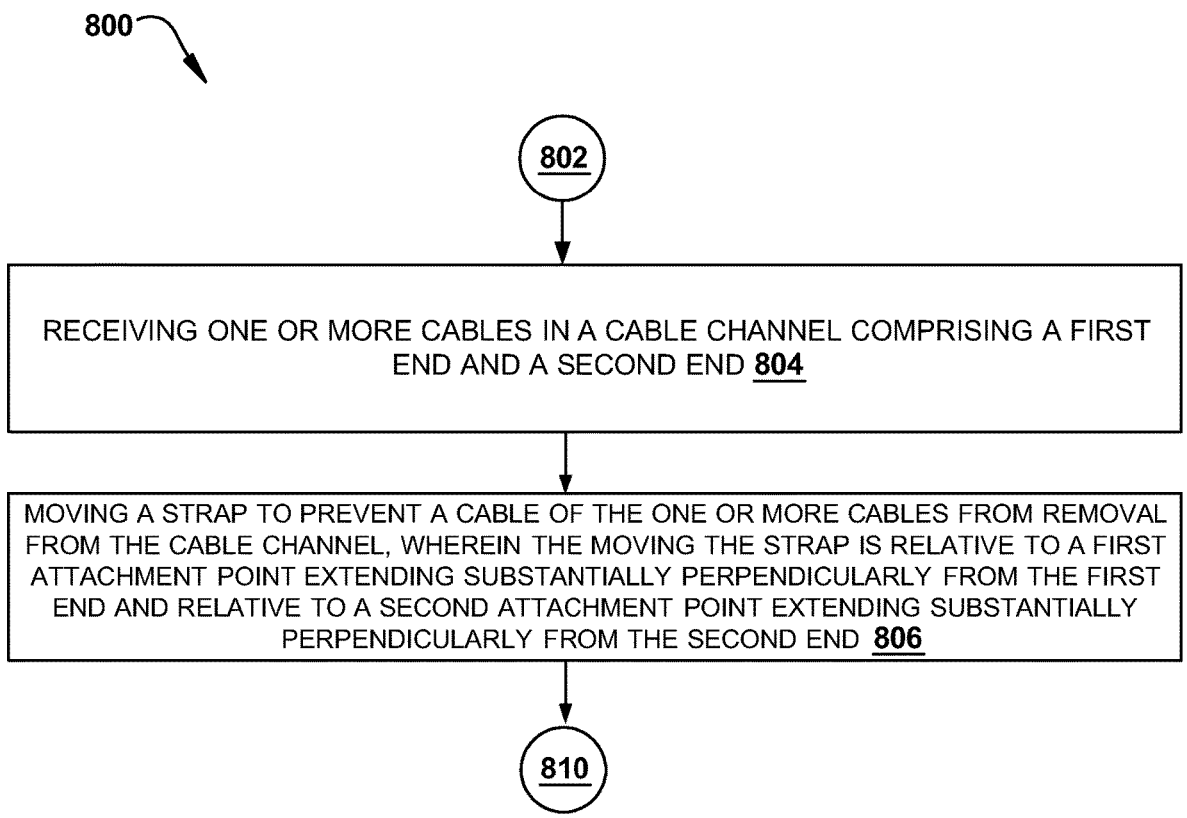
FIG. 8 illustrates an example process flow, in accordance with certain embodiments of this disclosure.

FIG. 8 illustrates an example process flow 800, in accordance with certain embodiments of this disclosure. It can be appreciated that there can be embodiments that implement the operations of FIG. 8 in a different manner than are depicted, or that implement more or fewer operations than are depicted in FIG. 8.

Process flow 800 begins with 802, then moves to operation 804. Operation 804 depicts receiving one or more cables in a cable channel (e.g., cable channel 104 of FIG. 1) comprising a first end and a second end. After operation 804, process flow 800 moves to operation 806.

Operation 806 depicts moving a strap (e.g., strap 106a of FIG. 1) to prevent a cable of the one or more cables from removal from the cable channel, wherein the moving the strap is relative to a first attachment point (e.g., server attachment 110a of FIG. 1) extending substantially perpendicularly from the first end and relative to a second attachment point (e.g., server attachment 110b of FIG. 1) extending substantially perpendicularly from the second end. In such a method, a strap (e.g., strap 106a, strap 106b, strap 106c, or strap 106d of FIG. 1) can be fixed to a cable channel (e.g., cable channel 104 of FIG. 1), and have one end detached from the cable channel to permit adding cables to the cable channel and removing cables from the cable channel.

In some examples, process flow 800 further comprises connecting the strap to a strap lock (e.g., strap lock 116a, strap lock 116b, strap lock 116c, or strap lock 116d of FIG. 1) in a first position that closes a first opening of the cable channel In some examples, the method further comprises moving the strap to a second position wherein a cable can be inserted into the cable channel via an opening between the strap and the cable channel In such examples, the first position can involve both ends of the strap being attached to the cable channel, to keep cables in the cable channel. Then, the second position can involve opening the strap from the cable channel so that cables can be inserted into the cable channel or removed from the cable channel.

In some examples, process flow 800 further comprises extending the cable channel away from a rack of the rackmount computer when the first attachment point and the second attachment point are attached to a rackmount computer via the first attachment point and the second attachment point. That is, such a method can be used to implement cable management in a way that adds 0U of height to an associated server rack.

In some examples, process flow 800 further comprises pivoting the cable channel relative to the first attachment and the second attachment. That is, in some examples, the cable channel can be pivoted relative to an associated server rack so that FRUs of the server rack can be accessed more easily.

In some examples, the first attachment point and the second attachment point flair toward a midpoint of the cable channel That is, a length of the cable channel can be longer than a distance between the first attachment point and a second attachment point.

In some examples, process flow 800 further comprises fixing the cable channel in place relative to an associated rackmount computer when a first latch and a second latch are disengaged. In some examples, the method further comprises rotating the cable channel relative to the associated rackmount computer when the first latch and the second latch are engaged. This can be functionality as described with respect to latch 102a and latch 102b of FIG. 1.

Example Implementations

In some examples, a cable management system (e.g., cable management bar 100 of FIG. 1) can comprise a cable channel (e.g., cable channel 104 of FIG. 1) configured to receive one or more cables and comprising a first end and a second end. Such an example cable management system can also comprise a first attachment point extending perpendicularly from the first end (e.g., server attachment 110a of FIG. 1). Such an example cable management system can also comprise a second attachment point (e.g., server attachment 110b of FIG. 1) extending perpendicularly from the second end, the first attachment point and the second attachment point configured to attach to a rackmount computer, the cable management system configured to extend away from a rack in which the rackmount computer is positioned when attached to the rackmount computer via the first attachment point and the second attachment point, and when the rackmount computer is mounted in the rack. That is, in some examples, such a cable management system can extend horizontally out of a rack, so occupies zero rack units (which can be referred to as 0U) of additional height within the rack. This can also be stated as, wherein the cable management system does not extend a height of rack units of the rackmount computer when attached to the rackmount computer.

In some examples, such a cable management system further includes a first push latch (e.g., latch 102a of FIG. 1) that locks the cable management system into position when in a first position, and that enables, or allows for, pivoting the cable channel relative to the first attachment point and to the second attachment point when in a second position. In some examples, such a cable management system further includes a second push latch (e.g., latch 102b of FIG. 1) that locks the cable management system into position when in the first position, and that enables pivoting of the cable channel relative to the first attachment point and to the second attachment point when the first push latch is in the second position and the second push latch is in the second position. The first position can be a not-engaged position of a latch and the second position can be a depressed position of the latch. The latches can be used to fix a cable management system in a neutral position (as described elsewhere) when the latches are not engaged.

In some examples, the cable management system is configured to lock to the rackmount computer when the first push latch and the second push latch are in the first position. That is, latches can be used to engage and disengage server attachments (e.g., server attachment 110a and server attachment 110b of FIG. 1), and these server attachments can be used to fix a cable management system to a rackmount server when engaged.

In some examples, the cable management system is configured to release from the rackmount computer when the first push latch and the second push latch are in the second position. That is, when the first push latch and the second push latch are depressed, this may cause the server attachments to release, so that the cable management system can be detached from a rackmount server.

In some example cable management systems, the first end of the cable channel comprises a first opening configured to facilitate removal of a first cable from the cable management system. This can be one end of a cable management bar, such as cable channel 504 of FIG. 5 where some of cables 552 exit cable channel 504 via an end of cable management bar. In some example cable management systems, the second end of the cable channel comprises a second opening configured to facilitate removal of a second cable from the cable management system. This can be another end of a cable management bar, such as cable channel 504 of FIG. 5 where some of cables 552 exit channel 504 via an end of cable management bar.

In some examples, a cable management bar comprises a cable channel (e.g., cable channel 104 of FIG. 1) comprising a first end and a second end, and configured to fit one or more cables within the cable channel. Such an example cable management bar can also comprise a first attachment point (e.g., server attachment 110a of FIG. 1) extending in a first perpendicular direction from the first end. Such an example cable management bar can also comprise a second attachment point (e.g., server attachment 110b of FIG. 1) extending in a second perpendicular direction from the second end, where the cable channel is configured to pivot relative to the first attachment point and relative to the second attachment point. Using the example of FIG. 1, a portion of high-density cable management bar 100 (which can comprise latch 102a, latch 102b, cable channel 104, cable strap 106a, cable strap 106b, cable strap 106c, cable strap 106d, side 108a, side 108b, strap fastener 116a, strap fastener 116b, strap fastener 116c, and strap fastener 116d) can pivot relative to another portion of high-density cable management bar 100 (which can comprise server attachment 110a, server attachment 110b, attachment head 112a, and attachment head 112b). The axis that a portion of high-density cable management bar 100 pivots on can be defined by a point at which side 108a connects with server attachment 110a, and a point at which side 108b connects with server attachment 110b. Such an example cable management bar can pivot relative to its rackmount server (to which the first attachment point and second attachment point can be affixed), so as to provide access to components of the rackmount server.

In some examples, the cable channel is configured to pivot (e.g., upward) relative to a computer rack to provide access to a first component of an associated rackmount computer of the computer rack located in a lower part of a chassis of a rackmount computer. In some examples, the first attachment point and the second attachment point maintain a fixed position relative to a server to which the first attachment point and the second attachment point are attached when the cable channel pivots.

In some examples, the cable management bar can comprise a strap (e.g., cable strap 106a, cable strap 106b, cable strap 106c, or cable strap 106d of FIG. 1) comprising an end attached to the cable channel, and configured to maintain a location of a cable of the one or more cables in the cable channel That is, a strap can comprise one end that is fixed to a cable channel, and a second end that is optionally attached to the cable channel (e.g., via strap lock 116a, strap lock 116b, strap lock 116c, or strap lock 116d of FIG. 1) or disengaged from the cable channel.

In some examples, the strap flexible material. In some examples, this flexible material comprises a rubber.

In some examples, a system comprises a cable channel (e.g., cable channel 104 of FIG. 1) configured to fit one or more cables and comprising a first end and a second end. In some examples, the system further comprises a first attachment point (e.g., server attachment 110a of FIG. 1) extending perpendicularly from the first end. In some examples, the system further comprises a second attachment point (e.g., server attachment 110b of FIG. 1) extending perpendicularly from the second end. In some examples, the system further comprises a moveable strap (e.g., cable strap 106a, cable strap 106b, cable strap 106c, or cable strap 106d of FIG. 1) configured to keep a cable located in the cable channel. This system can comprise a cable management bar that utilizes one or more rubber straps to keep cables secured within a cable channel, while also being moveable to facilitate removing one or more cables from the cable channel or inserting one or more cables into the cable channel.

In some examples, the moveable strap is configured to connect to a strap lock (e.g., strap lock 116a, strap lock 116b, strap lock 116c, or strap lock 116d of FIG. 1) in a first position that closes a first opening of the cable channel, and wherein the moveable strap is configured to move to a second position wherein a cable can be inserted into the cable channel via an opening between the strap and the cable channel. This can be an embodiment of how the moveable strap can be implemented to keep cables secured within a cable channel, while also being moveable to facilitate removing one or more cables from the cable channel or inserting one or more cables into the cable channel.

In some examples, the system is attached to a rackmount computer via the first attachment point and the second attachment point, the system extends away from a rack of the rackmount computer. That is, the system (which can be a cable management bar) can add 0U of height to a rackmount server to which it is affixed and a rack associated with the rackmount server.

In some examples, the cable channel is configured to pivot relative to the first attachment and the second attachment. That is, in some examples, you can pivot, move, or rotate a portion of the cable management bar (e.g., cable channel 104 of FIG. 1) up. Moving the portion of the cable management bar in this manner can facilitate access to a portion of the associated rackmount server, while still keeping the cable management bar attached to the rackmount server.

In some examples, the first attachment point and the second attachment point flair toward a midpoint of the cable channel That is, instead of being perfectly perpendicular to the cable channel, in some examples, the distance between the first attachment point and the second attachment point is less where the first attachment point and the second attachment point connect with a rackmount server than the length of the cable management bar. In some examples, this approach, with its longer cable channel, can provide increased control of the placement of cables relative to a shorter cable channel, and can facilitate exiting the cables from the cable channel after the cables have extended past their associated rackmount server.

In some examples, the system further comprises two latches (e.g., latch 102a and latch 102b of FIG. 1) that, when disengaged, lock the cable channel in place relative to an associated rackmount computer, and when engaged, permit the cable channel to rotate relative to the associated rackmount computer. These latches can be push latches. The latches can be depressed to permit the cable channel to rotate relative to a rackmount server or relative to a cable management bar's attachment points. Additionally, the latches can be not engaged, to permit the cable channel to lock into a neutral position (as described elsewhere) relative to a rackmount server or relative to a cable management bar's attachment points.

CONCLUSION

The various embodiments can be implemented as a method, apparatus, or article of manufacture using standard engineering techniques to produce software, firmware, hardware, or any combination thereof to implement one or more aspects of the disclosed subject matter. Of course, those skilled in the art will recognize many modifications can be made to this configuration without departing from the scope or spirit of the various embodiments.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A cable management system, comprising:
   a u-shaped cable channel configured to receive one or more cables and comprising a first end and a second end;
   a first attachment point extending perpendicularly from the first end; and
   a second attachment point extending perpendicularly from the second end,
      wherein the first attachment point and the second attachment point are configured to attach to a rackmount computer,
      wherein the first attachment point comprises a pivot channel in which a pivot limiter of the cable channel is disposed, wherein the pivot limiter restricts motion of the cable channel to a circular or substantially circular motion relative to the rackmount computer, wherein the pivot limiter restricts motion of the cable channel in one direction when the cable channel is extended away from a rack in which the rackmount computer is positioned, wherein the pivot channel comprises substantially an arc channel, and wherein the pivot channel is configured to permit a limited range of pivoting of the cable relative to the first attachment point, and
      wherein the cable management system is configured to extend away from the rack in which the rackmount computer is positioned when attached to the rackmount computer via the first attachment point and the second attachment point, and when the rackmount computer is mounted in the rack.

2. The cable management system of claim 1, wherein the cable management system does not extend a height of rack units of the rackmount computer when attached to the rackmount computer.

3. The cable management system of claim 1, further comprising:
   a first push latch that locks the cable management system into position when in a first position, and that enables pivoting of the cable channel relative to the first attachment point and to the second attachment point when in a second position.

4. The cable management system of claim 3, further comprising:
a second push latch that locks the cable management system into position when in the first position, and that enables pivoting of the cable channel relative to the first attachment point and to the second attachment point when the first push latch is in the second position and the second push latch is in the second position.

5. The cable management system of claim 4, wherein the cable management system is further configured to lock to the rackmount computer when the first push latch and the second push latch are in the first position.

6. The cable management system of claim 5, wherein the cable management system is further configured to release from the rackmount computer when the first push latch and the second push latch are in the second position.

7. The cable management system of claim 1, wherein the first end of the cable channel comprises a first opening configured to facilitate removal of a first cable from the cable management system.

8. The cable management system of claim 7, wherein the second end of the cable channel comprises a second opening configured to facilitate removal of a second cable from the cable management system.

9. The cable management system of claim 1, wherein the cable channel is configured to receive the one or more cables via an opening oriented between the first attachment point and the second attachment point.

10. The cable management system of claim 1, wherein the first attachment point flares inward relative to the second attachment point in a direction toward the cable channel and away from the rackmount computer when the cable management system is connected to the rackmount computer, and wherein the second attachment point flares inward relative to the first attachment point in a direction toward the cable channel and away from the rackmount computer when the cable management system is connected to the rackmount computer.

11. The cable management system of claim 1, wherein the first attachment point comprises a first piece and a second piece, wherein the first piece is configured to remain in a fixed position relative to the rackmount computer when attached to the rackmount computer, and wherein the second piece is configured to pivot relative to the rackmount computer.

12. A cable management bar mounted on a rackmount computer, comprising:
a u-shaped cable channel comprising a first end and a second end, and configured to fit one or more cables within the cable channel;
a first attachment point extending in a first perpendicular direction from the first end; and
a second attachment point extending in a second perpendicular direction from the second end, wherein the cable channel is further configured to pivot relative to the first attachment point and relative to the second attachment point, and wherein the first attachment point comprises a pivot channel in which a pivot limiter of the cable channel is disposed, wherein the pivot limiter restricts motion of the cable channel in one direction when the cable channel is extended away from a rack in which the rackmount computer is positioned, wherein the pivot limiter restricts motion of the cable channel to a circular or substantially circular motion relative to the rackmount computer, wherein the pivot channel comprises an arced channel, and wherein the pivot channel is configured to permit a limited range of pivoting of the cable relative to the first attachment point.

13. The cable management bar of claim 12, wherein the cable channel is further configured to pivot upward relative to a computer rack to provide access to a first component of an associated rackmount computer of the computer rack located in a lower part of a chassis of a rackmount computer.

14. The cable management bar of claim 12, wherein the first attachment point and the second attachment point maintain a fixed position relative to a server to which the first attachment point and the second attachment point are attached when the cable channel pivots.

15. The cable management bar of claim 12, further comprising:
a strap comprising an end attached to the cable channel, and configured to maintain a location of a cable of the one or more cables in the cable channel, and
wherein the cable channel comprises a strap fastener that is configured to maintain the strap in a fixed position.

16. The cable management bar of claim 15, wherein the strap comprises a flexible material.

17. The cable management bar of claim 16, wherein the flexible material comprises rubber.

18. An apparatus for supporting a cable management system, comprising:
a u-shaped cable channel configured to receive one or more cables and comprising a first end and a second end;
a first attachment point extending perpendicularly from the first end; and
a second attachment point extending perpendicularly from the second end,
an attachment point extending perpendicularly from an end of the cable channel; and
wherein the first attachment point is configured to attach to a rackmount computer,
wherein the first attachment point comprises a pivot channel in which a pivot limiter of the cable channel is disposed, wherein the pivot limiter restricts motion of the cable channel in one direction when the cable channel is extended away from a rack in which the rackmount computer is positioned, wherein the pivot channel comprises substantially an arc channel, and wherein the pivot channel is configured to permit a limited range of pivoting of the cable relative to the first attachment point, and
wherein the cable management system is configured to extend away from the rack in which the rackmount computer is positioned when attached to the rackmount computer via the first attachment point and the second attachment point, and when the rackmount computer is mounted in the rack.

19. The apparatus of claim 18, wherein the apparatus does not extend a height of rack units of the rackmount computer when attached to the rackmount computer.

20. The apparatus of claim 18, further comprising:
a push latch that locks the apparatus into position when in a first position, and that enables pivoting of the cable channel relative to the attachment point when in a second position.

* * * * *